Figure 1:
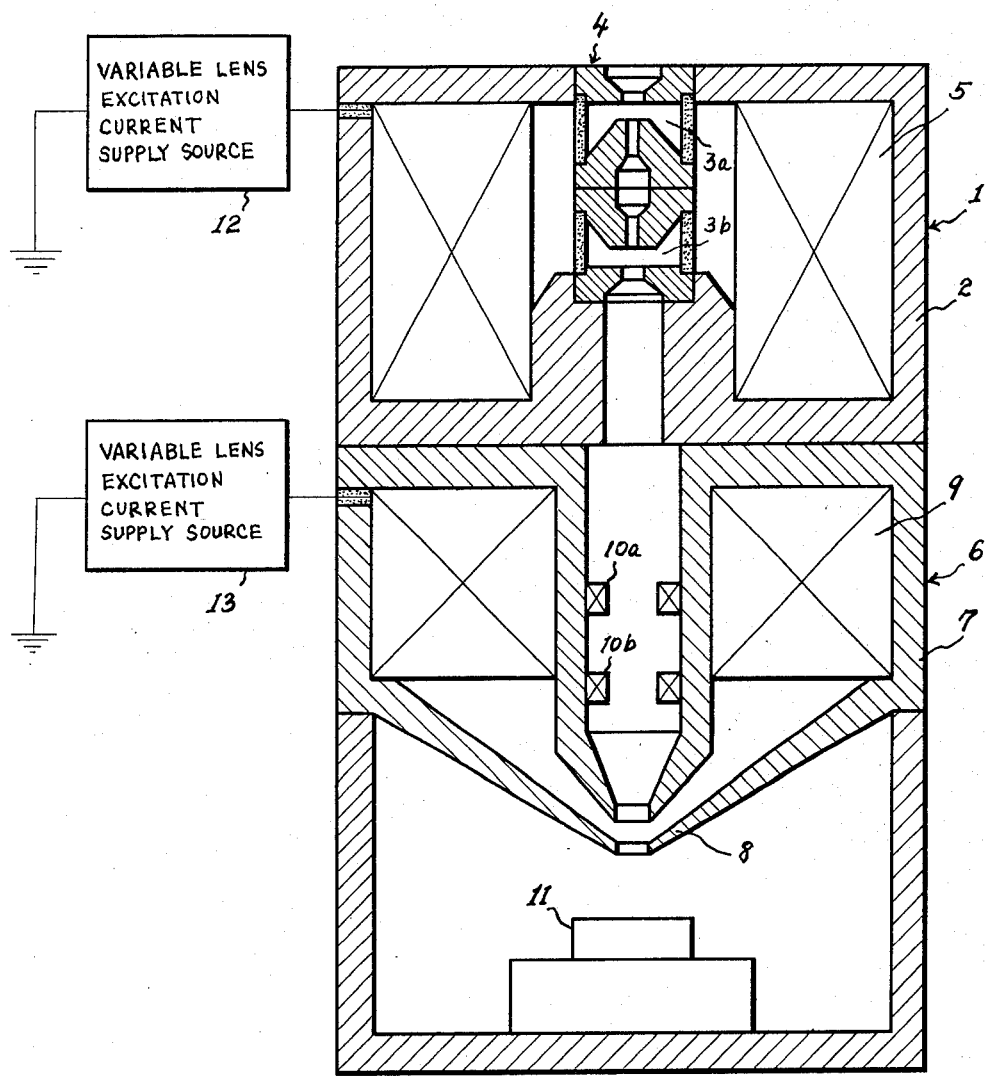

United States Patent [19]
Ueno et al.

[11] 3,978,338
[45] Aug. 31, 1976

[54] ILLUMINATION SYSTEM IN A SCANNING ELECTRON MICROSCOPE

[75] Inventors: Katsuyoshi Ueno; Hirotami Koike, both of Akishima, Japan

[73] Assignee: Nihon Denshi Kabushiki Kaisha, Tokyo, Japan

[22] Filed: Apr. 7, 1975

[21] Appl. No.: 565,628

[30] Foreign Application Priority Data
Apr. 16, 1974 Japan.............................. 49-42979

[52] U.S. Cl............................. 250/396 R; 250/310; 250/311
[51] Int. Cl.$^2$........................ G21K 1/08; G21K 7/00
[58] Field of Search..................... 250/309, 310, 311

[56] References Cited
UNITED STATES PATENTS
2,369,782  2/1945  Hillier................................ 250/396
2,586,559  2/1952  Page................................... 250/396
3,696,246  10/1972  Buchanan.......................... 250/311

*Primary Examiner*—Alfred E. Smith
*Assistant Examiner*—T. N. Grigsby
*Attorney, Agent, or Firm*—Webb, Burden, Robinson & Webb

[57] ABSTRACT

A scanning electron microscope comprising a double gap lens in its electron beam irradiating system. The double gap lens is arranged between the electron gun and the final stage condenser lens, and is excited by a lens current such that a large change of electron beam diameter may be controlled by a small change of lens excitation current.

2 Claims, 3 Drawing Figures

ILLUMINATION SYSTEM IN A SCANNING ELECTRON MICROSCOPE

This invention relates to a novel illumination system for use in a scanning electron microscope or the like.

The wide spread use of scanning electron microscopes over recent years have been quite remarkable. Today, they are diversely utilized in diverse fields of scientific and medical research endeavors. Scanning electron microscopes, although generally marketed as a single purpose instrument, can also be used as an X-ray microanalyzer if the performance is sufficiently high, thereby enhancing its use.

In a typical electron beam irradiating system as incorporated in a scanning electron microscope, the crossover image (20 μm or 50 μm in diameter) formed immediately below the electron gun is converged and focused on the surface of the specimen by a two or more stage lens system. In this case, in order to obtain a high resolution scanning electron microscope image, it is necessary to condense the size of the beam spot irradiating the specimen surface to around 50 ~100 A. However, to use the apparatus for low magnification image observation or as an X-ray microanalyzer, it is necessary to increase the diameter of the beam spot up to the micron order in size and increase the intensity of the beam current. The size of the beam spot is usually varied by regulating the first condenser lens current. Where the beam spot size variation is large, it becomes necessary to vary the first condenser lens current over a wide range. Now, to change the excitation current intensity over such a wide range presents certain problems. It is difficult to provide an excitation current power supply capable of varying the intensity to such a degree. Also, the intensity of the leakage flux in the electron beam path varies over a greater range and there is a degree of beam shift. Thus, the apparatus becomes extremely inconvenient from a handling point of view.

It is therefore an object of this invention to provide an illumination system capable of varying the beam spot size over a wide range with only a slight variation of the excitation current intensity.

Briefly stated, in order to achieve this purpose, this invention provides a double gap lens in the electron beam irradiating system, said lens being excited so strongly that a large change of electron beam current and diameter is controlled by a small variation of excitation current intensity.

Figure 2:
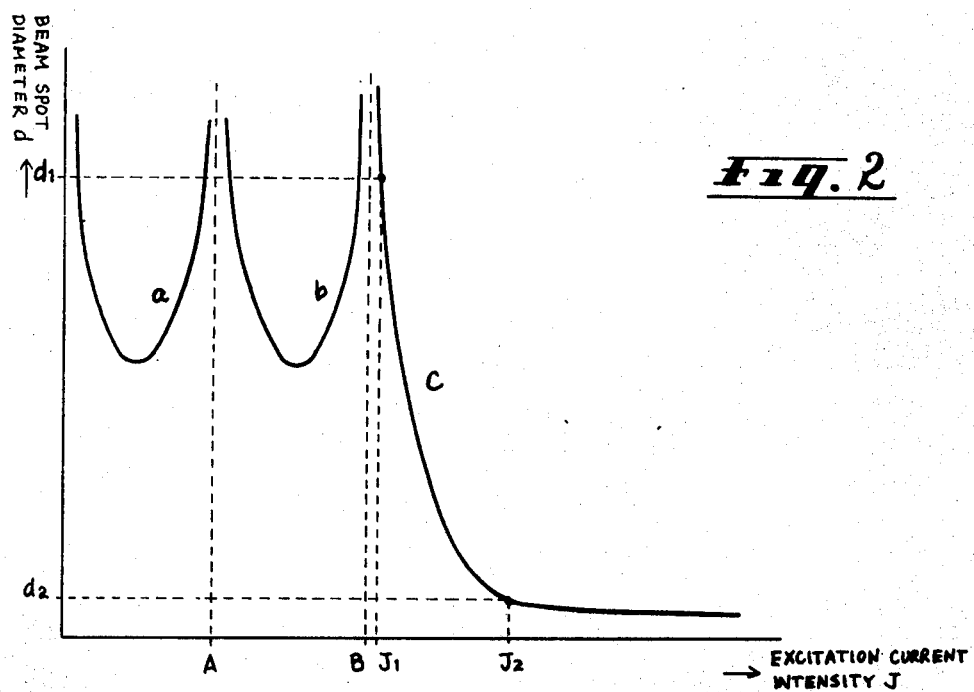
Figure 3:
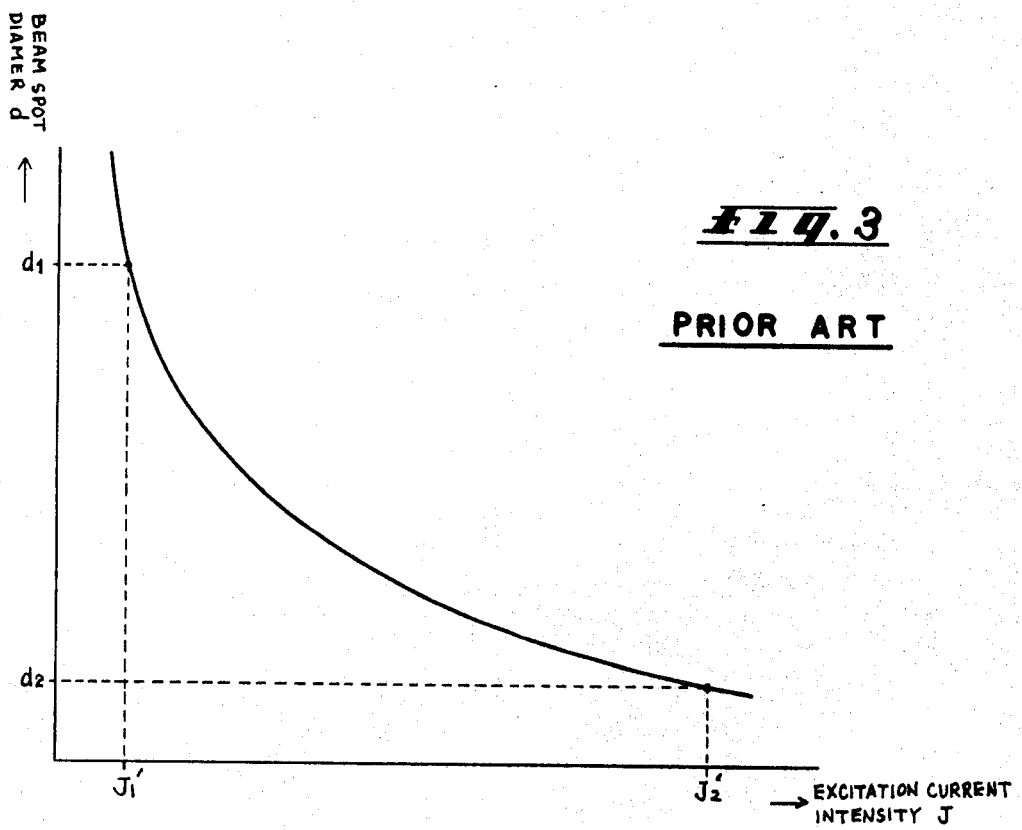

This invention will become more readily apparent by reading through the following detailed description in conjunction with the accompanying drawings of which, FIG. 1 is a drawing showing one embodiment of this invention, FIG. 2 is a schematic diagram showing the relation between the excitation current intensity and beam spot size in this invention, and FIG. 3 is a schematic drawing showing the relation between the excitation current intensity and beam spot size in an ordinary scanning electron microscope.

Referring to FIG. 1, a first condenser lens 1 comprises a yoke 2, magnetic pole pieces 4 having two pole gaps 3a and 3b, and an excitation coil 5. Located immediately below the first condenser lens 1, a second condenser lens 6, comprises a yoke 7, magnetic pole pieces 8 and an excitation coil 9. Deflection coils 10a and 10b are located within the yoke. A specimen 11 is located immediately below the second condenser lens 6. Lenses 1 and 6 and their variable lens excitation current supply sources 12 and 13 serve to focus the electron beam on the specimen and deflection coils 10a and 10b serve as a scanning means for scanning the electron beam over the specimen surface.

FIG. 2 shows the variation curve of the beam spot diameter $d$ with respect to the first condenser lens excitation current $J$ adjusted by the variable excitation current supply source 12 of the lens system described in FIG. 1. By varying $J$ over a wide range a discontinuous curve having three distinct portions a, b and c diverging at a first diverging point A and a second diverging point B respectively, is obtained. Curve portions, a and b are unsuitable for high resolution observation as the beam spot size cannot be reduced sufficiently. On the other hand, by utilizing curve portion c which lies between $J_1$ and $J_2$; i.e., in a strongly excited region, both a large and extremely fine beam spot diameter can be obtained within a small change of excitation current.

On the other hand, the variation curve for a scanning electron microscope incorporating conventional illumination system composed of only single gap lenses is as shown in FIG. 3. The beam spot diameter $d$ varies with respect to the excitation current intensity $J$ (viz., from $J'_1$ and $J'_2$) such that the amount of the required current change is several times greater than required in the inventive device disclosed herein.

As described above, in our invention, the drawbacks inherent on the lens system described in the prior art; viz., complication of lens power supply design, beam shift, etc. are substantially eliminated. Furthermore, although the embodiment described above comprised only one lens 6 below the main lens 1, two or more such lenses can be used as desired.

Having thus described the invention with detail and particularity as required by the patent laws, what is desired protected by Letters Patent is set forth in the following claims:

1. An illumination system for directing an electron beam from a source to produce a very fine beam diameter spot on a specimen, said system useful in a scanning electron microscope or the like, comprising
   a first lens having a plurality of pole gaps in a single magnetic circuit; and
   at least one independent lens;
   said first lens and at least one independent lens positioned along the beam path between the source and specimen, said first lens being nearer said source than said at least one independent lens;
   said first lens and at least one independent lens having in combination an excitation current-beam diameter at specimen curve wherein an excitation of the first lens is increased the beam diameter decreases somewhat and then diverges and thereafter in a highly sensitive mode with a very small increase in excitation current beam diameter decreases rapidly to a very fine diameter and,
   means for supplying sufficient excitation current to said first lens to operate said system in the highly sensitive mode such that a small variation in excitation current results in a large variation in beam diameter.

2. An illumination system for directing an electron beam from a source to produce a very fine beam diameter spot upon a specimen useful in a scanning electron microscope or the like; comprising a first lens having two pole gaps in a single magnetic circuit; and at least one independent lens;

said first lens and at least one independent lens positioned along the beam path between the source and specimen, said first lens being nearer said source than said at least one independent lens;

said first lens and at least one independent lens having an excitation current-beam diameter at specimen curve as shown in FIG. 2 wherein as excitation of the first lens increases a highly sensitive mode being the portion of the curve labeled c on FIG. 2 is obtained; and, means for supplying sufficient excitation current to said first lens to operate said system in the highly sensitive mode such that a small variation in excitation current results in a large variation in beam diameter.

* * * * *